United States Patent
Spick et al.

(10) Patent No.: US 11,459,801 B2
(45) Date of Patent: Oct. 4, 2022

(54) MOTOR VEHICLE DOOR HANDLE WITH DEVICE FOR DETECTING AN INTENTION TO LOCK AND TO UNLOCK A MOTOR VEHICLE DOOR

(71) Applicants: Continental Automotive France, Toulouse (FR); Continental Automotive GmbH, Hannover (DE)

(72) Inventors: Gabriel Spick, Toulouse (FR); Olivier Gerardiere, Tournefeuille (FR)

(73) Assignees: Continental Automotive France; Continenal Automotive GmbH

( * ) Notice: Subject to any disclaimer, the term of this patent is extended or adjusted under 35 U.S.C. 154(b) by 553 days.

(21) Appl. No.: 16/480,755

(22) PCT Filed: Jun. 7, 2018

(86) PCT No.: PCT/FR2018/051316
§ 371 (c)(1),
(2) Date: Jul. 25, 2019

(87) PCT Pub. No.: WO2018/229395
PCT Pub. Date: Dec. 20, 2018

(65) Prior Publication Data
US 2019/0390487 A1 Dec. 26, 2019

(30) Foreign Application Priority Data
Jun. 13, 2017 (FR) ........................ 1755286

(51) Int. Cl.
*E05B 77/34* (2014.01)
*E05B 81/76* (2014.01)
(Continued)

(52) U.S. Cl.
CPC .............. *E05B 77/34* (2013.01); *E05B 81/77* (2013.01); *E05B 83/36* (2013.01); *E05B 85/10* (2013.01);
(Continued)

(58) Field of Classification Search
CPC ........ E05B 17/002; E05B 77/34; E05B 81/64; E05B 81/76; E05B 81/77; E05B 85/10; (Continued)

(56) References Cited

U.S. PATENT DOCUMENTS 7,180,281 B2 *  2/2007  Inuzuka .................. E05B 81/76
                                                  324/690
7,400,153 B2 *  7/2008  Shoji .................... H03K 17/962
                                                  307/10.1
(Continued)

FOREIGN PATENT DOCUMENTS

CN       101957217 A       1/2011
CN       102343884 A       2/2012
(Continued)

OTHER PUBLICATIONS

Chinese Office Action for Chinese Application No. 201880015146.X, dated Jun. 1, 2020, with translation, 7 pages.
(Continued)

*Primary Examiner* — Kristina R Fulton
*Assistant Examiner* — Emily G. Brown
(74) *Attorney, Agent, or Firm* — RatnerPrestia

(57) ABSTRACT

A device for detecting the intention of a user to lock or to unlock a motor vehicle door. The device being incorporated within a handle, including: a capacitive sensor for detecting the approach and/or the contact of a hand of the user toward/with the handle, including at least one electrode, located in proximity to a detection surface of the handle, that is capable of detecting the approach of the hand of a user
(Continued)

toward the detection surface; a microcontroller; and a voltage source. At least a portion of the electrode takes a continuous shape of successive arches which allow water to flow away and are connected to one another at their bases by junctions, the junctions being pressed against the detection surface, thus forming a sealtight interface.

7 Claims, 3 Drawing Sheets

(51) Int. Cl.
    *E05B 85/10*     (2014.01)
    *E05B 47/00*     (2006.01)
    *H03K 17/96*     (2006.01)
    *E05B 83/36*     (2014.01)

(52) U.S. Cl.
    CPC . *E05B 2047/0056* (2013.01); *E05Y 2800/424* (2013.01); *H03K 2017/9602* (2013.01)

(58) Field of Classification Search
    CPC .......... H03K 17/962; H03K 2017/9602; G06F 3/0448; G06F 3/044; G01R 27/2605; H01H 13/06
    USPC ......................................................... 292/336
    See application file for complete search history.

(56) References Cited

U.S. PATENT DOCUMENTS

| | | | |
|---|---|---|---|
| 8,382,170 B2 * | 2/2013 | Ieda ........................ | E05B 85/16 |
| | | | 292/336.3 |
| 9,033,379 B2 | 5/2015 | Tateishi et al. | |
| 9,108,591 B2 * | 8/2015 | Ieda ........................ | E05B 81/78 |
| 9,981,420 B2 * | 5/2018 | Benaissa ................. | C03B 23/02 |
| 10,428,562 B2 | 10/2019 | Guibbert et al. | |
| 2005/0001633 A1 | 1/2005 | Okushima et al. | |
| 2008/0061933 A1 | 3/2008 | Ieda et al. | |
| 2011/0012378 A1 | 1/2011 | Ueno et al. | |
| 2017/0030119 A1 | 2/2017 | Usui | |

FOREIGN PATENT DOCUMENTS

| | | | | |
|---|---|---|---|---|
| CN | 103104143 A | 5/2013 | | |
| CN | 105089384 A | 11/2015 | | |
| DE | 102005061755 A1 | 6/2007 | | |
| DE | 102014107809 A1 | 12/2015 | | |
| DE | 102014011229 A1 * | 2/2016 | .............. | E05F 15/00 |
| EP | 1108834 A2 | 6/2001 | | |
| FR | 2905716 A1 | 3/2008 | | |
| KR | 1020170007127 A | 1/2017 | | |

OTHER PUBLICATIONS

English Translation of the Written Opinion for International Application No. PCT/FR2018/051316, dated Sep. 18, 2018, 7 pages.
Korean Notice of Allowance for Application No. 10-2019-7034046, dated Oct. 13, 2021 with translation, 3 pages.
International Search Report and Written Opinion for International Application No. PCT/FR2018/051316, dated Sep. 18, 2018—9 pages.

* cited by examiner

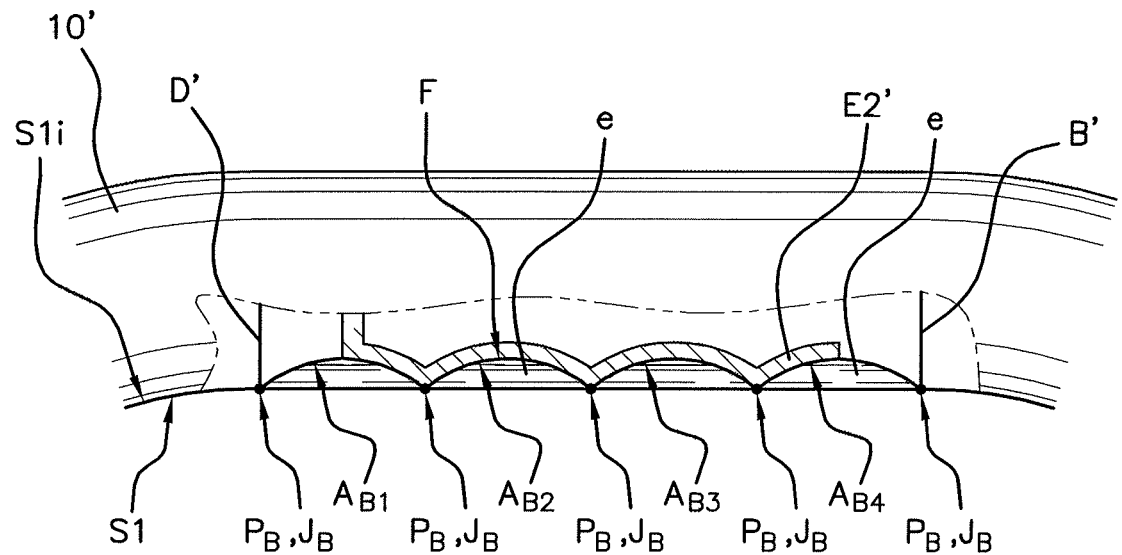
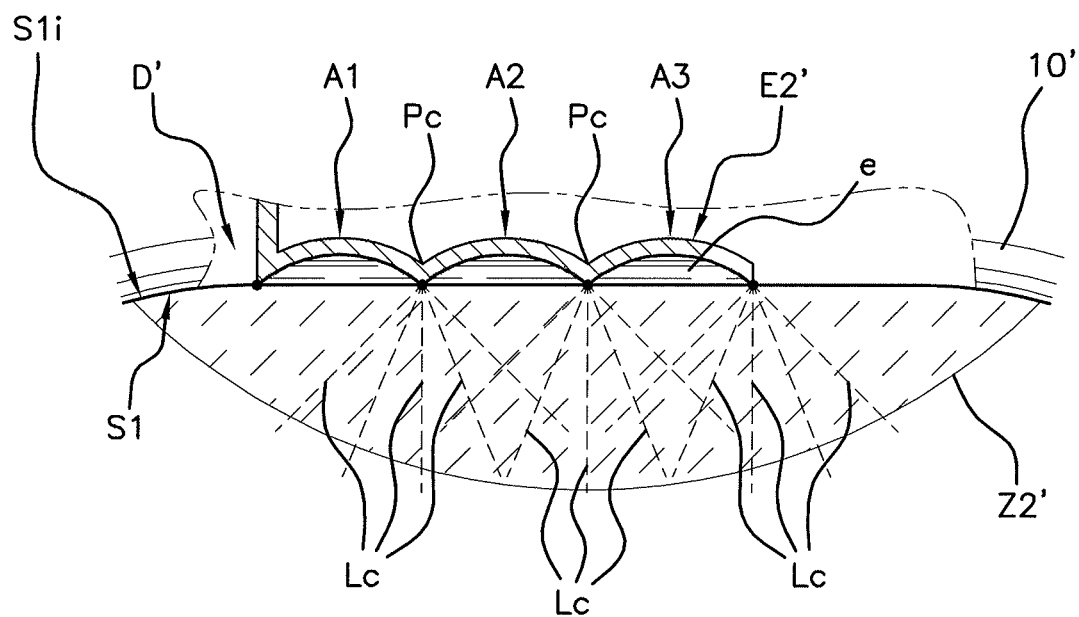

MOTOR VEHICLE DOOR HANDLE WITH DEVICE FOR DETECTING AN INTENTION TO LOCK AND TO UNLOCK A MOTOR VEHICLE DOOR

CROSS REFERENCE TO RELATED APPLICATIONS

This application is the U.S. National Phase Application of PCT International Application No. PCT/FR2018/051316, filed Jun. 7, 2018, which claims priority to French Patent Application No. 1755286, filed Jun. 13, 2017, the contents of such applications being incorporated by reference herein.

FIELD OF THE INVENTION

The invention relates to a device for detecting the intention of a user to lock or to unlock a motor vehicle door and a vehicle door handle comprising said device.

BACKGROUND OF THE INVENTION

Nowadays, vehicle door handles are fitted with devices for detecting the presence of a user. The detection of the presence of a user, coupled with the recognition of a "hands-free" electronic fob for remote access control carried by said user, allows the remote locking and unlocking of the opening elements of the vehicle. Thus, when the user, carrying the corresponding electronic fob identified by the vehicle, wishes to unlock the vehicle, they approach the handle or touch the door handle of the vehicle, and the opening elements of the vehicle are then automatically unlocked. By approaching or by pressing on a precise location of the door handle of the vehicle, called "unlocking zone", the door (or alternatively all of the opening elements) is (are) unlocked without any other action from the user. Conversely, when the user, still carrying the necessary fob identified by the vehicle, wishes to lock their vehicle, they close the door of their vehicle and they approach or momentarily press on another precise location of the handle, called the "locking zone". This movement makes it possible to lock the opening elements of the vehicle automatically.

These presence detection devices generally comprise two capacitive sensors, in the form of two electrodes connected electrically to a printed circuit and integrated into the door handle, each in a precise locking or unlocking zone. Generally, one electrode is dedicated to each zone, that is to say one electrode is dedicated to detecting the approach and/or the contact of the user's hand in the locking zone and one electrode is dedicated to detecting the approach and/or the contact of the user's hand in the unlocking zone.

The presence detection device further comprises a, generally LF (low-frequency), radiofrequency antenna. The detection device is connected to the vehicle's electronic computer (ECU: abbreviation for "electronic control unit") and sends it a presence detection signal. The electronic computer of the vehicle has, beforehand, identified the user as being authorized to access this vehicle, or alternatively, following the reception of this presence detection signal, it performs this identification. To this end, it sends an identification request to the fob (or to the remote controller) carried by the user by way of the radiofrequency antenna. This fob in response sends its identification code to the electronic computer of the vehicle through RF (radiofrequency) waves. If the electronic computer recognizes the identification code as the one authorizing access to the vehicle, it triggers the locking/unlocking of the door (or of all of the opening elements). If, on the other hand, the electronic computer has not received any identification code or if the received identification code is erroneous, locking or unlocking is not performed.

Such vehicles are therefore equipped with door handles comprising a detection device, itself comprising a generally low-frequency radiofrequency antenna, and two electrodes connected to a microcontroller, integrated into a printed circuit and supplied with a voltage.

Purely for the sake of explanation, consideration will be given here to a detection device D comprising two capacitive sensors in the form of two electrodes, one electrode dedicated to the unlocking zone and one electrode dedicated to the locking zone, said two electrodes being connected to a printed circuit comprising a microcontroller, and an LF antenna. A detection device D from the prior art is described with reference to FIG. 1.

FIG. 1 shows a motor vehicle door handle 10 (vehicle not shown) in which there is situated a device D for detecting the presence of a user. Said door handle 10 comprises a first outer surface S1 oriented in the direction of the door P and a second outer surface S2, opposite the first outer surface S1 and therefore oriented on the side opposite the vehicle, more precisely toward the user (not shown). This detection device D, which generally takes the form of a housing B, comprises a first unlocking electrode E2, one face of which is situated close to the first outer surface S1, and control means 60 and an LF antenna (not shown), one face of which is situated close to the second outer surface S2, a second locking electrode E1, one face of which is situated close to the second outer surface S2, and control means 60. The first and the second electrodes E1, E2 are connected to the control means 60. These control means 60 measure the capacitance between the terminal each first and second electrode E1, E2 and ground, formed by the hand of the approaching user, so as to detect the presence (the approach and/or the contact) of a user in the detection zones, that is to say in a locking zone Z1 or in an unlocking zone Z2, and consist for example of a microcontroller 60 integrated into a printed circuit 80. The LF antenna (not shown) is for its part linked to an electronic computer on board the vehicle (not shown) of BCM ("body controller module") type, which manages the identification requests transmitted by said LF antenna. When the hand M of the user approaches the electrode E1 or E2, the user acts as a second electrode, linked to ground, which increases the capacitance of the detection capacitor to a capacitance higher than the nominal capacitance of the detection capacitor "at rest" (i.e. in the absence of a user).

The move in the capacitance above a threshold confirms the detection of the approach of the user's hand.

However, this detection device D from the prior art exhibits major drawbacks.

Specifically, the detection of the approach of a user using capacitive sensors (first and second electrodes E1 and E2) is not robust.

In particular, since the door handles are not sealtight, when water e seeps between one of the electrodes E1 or E2 (whether contained within the housing B or otherwise) and the inner surface of the handle located facing said electrode, the water then acts as a screen and approach detection is not guaranteed. This is illustrated in FIG. 1. In FIG. 1, water e is present between the locking electrode E1 and the handle 10, more specifically between the unlocking electrode E1 and the second inner surface S2$i$ of the handle 10.

The handle 10 comprises drain holes which, for esthetic reasons, are small, and do not remove the infiltrated water very quickly. This is all the more true in the case of saltwater, which is more viscous, the density of which being higher than that of rainwater.

The presence of water e at this location affects the approach detection performed by the locking electrode E1, and substantially decreases, or even completely eliminates, the locking detection zone Z1.

One of the possible solutions is to insert a sealtight foam between the housing and the inner surface of the handle, but this is expensive and requires an additional step in the process for manufacturing the handle. Additionally, foam has a low dielectric constant, close to that of air, and hence it has an insulating characteristic and decreases the detection zone of the electrode. The presence of foam does not always guarantee sealtightness, since the foam may eventually come loose.

SUMMARY OF THE INVENTION

An aspect of the invention therefore aims to overcome the drawbacks of the prior art by providing a detection device D that is insensitive to the presence of water between the electrode and the inner surface of the handle.

An aspect of the invention proposes a device for detecting the intention of a user to lock or to unlock a motor vehicle door, said device being incorporated within a handle, comprising:
  a capacitive sensor for detecting the approach and/or the contact of a hand of the user toward/with the handle, comprising at least one electrode, located in proximity to a detection surface of the handle, that is capable of detecting the approach of the hand of a user toward the detection surface;
  a microcontroller;
  a voltage source,
said device being noteworthy in that at least a portion of the electrode takes a continuous shape of successive arches, which arches allow water to flow away and are connected to one another at their bases by junctions, said junctions being pressed against the detection surface, thus forming a sealtight interface.

The junctions between two successive arches may be either pointlike or continuously linear.

In a second embodiment of an aspect of the invention, the detection device being contained within a housing, said housing also has, on a bottom, arches that are connected to one another at their bases by junctions so as to accommodate said electrode, such that at least a portion of the junctions of the electrode are pressed against the junctions of the bottom of the housing, said junctions of the bottom of the housing being themselves pressed against the detection surface, forming a sealtight interface.

Similarly, the junctions of the bottom of the housing may be either pointlike or continuous linear junctions.

An aspect of the invention applies to any door handle comprising a detection device according to any one of the features listed above.

Lastly, an aspect of the invention relates to any motor vehicle comprising a detection device according to any one of the features listed above.

BRIEF DESCRIPTION OF THE DRAWINGS

Other aims, features and advantages of aspects of the invention will become apparent on reading the description which follows, by way of nonlimiting example, and on examining the appended drawings, in which:

FIG. 3 shows, more particularly, the unlocking electrode E2' according to an aspect of the invention contained within a housing B' comprising the detection device D' according to an aspect of the invention;

FIG. 4 shows the electric field lines around the contact points Pc between the unlocking electrode E2' according to an aspect of the invention and the first inner surface S1$i$;

DETAILED DESCRIPTION OF THE PREFERRED EMBODIMENTS

Figure 1:
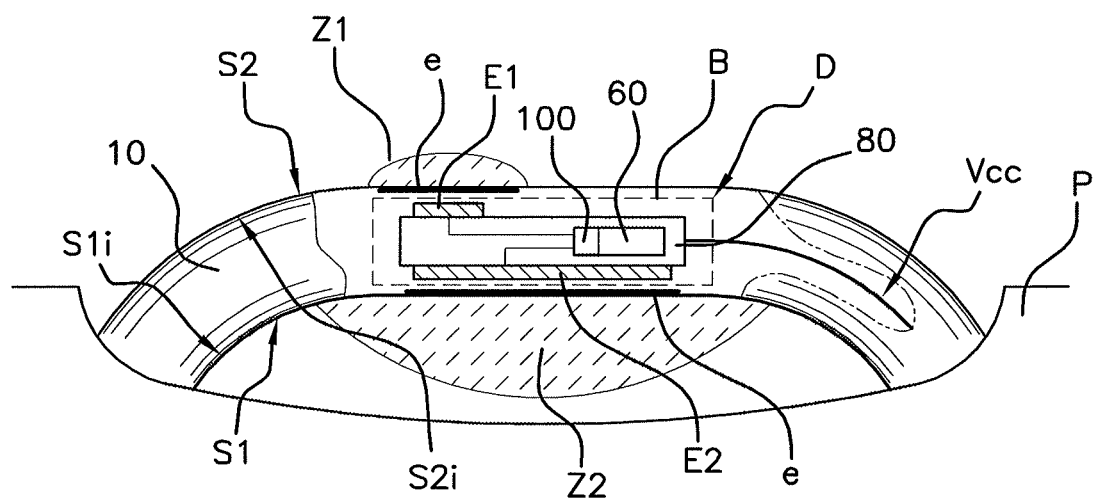
FIG. 1 shows a motor vehicle door P handle 10 comprising a detection device D of the prior art, illustrating the effect of water e seeping between the electrodes E1, E2 and the inner surfaces S2$i$, S1$i$ of the handle P.

As explained above, the detection device D of the prior art shown in FIG. 1 has the major drawback of no longer being operational when water e seeps into the handle P and gets stuck between an electrode (either the locking electrode E1 or the unlocking electrode E2, or both said electrodes) and the inner surface of the handle 10 located facing said electrode (the second inner surface S2$i$ and the first inner surface S1$i$, respectively).

Water e that has seeped between the electrode E1, E2 and the inner surface of the handle S2$i$, S1$i$ acts as a screen connected to ground located in front of the electrode E1, E2 and affects the detection of the approach of the hand of a user toward said electrode E1, E2, which is no longer reliable. The detection zone Z1, Z2 is then substantially decreased in size, to the extent that said detection zone Z1, Z2 may no longer exist.

An aspect of the invention proposes a detection device D' making it possible to overcome this drawback.

According to an aspect of the invention, the device D' for detecting the intention of a user to lock or to unlock a motor vehicle door is incorporated for example within a handle, although it may also be incorporated within the bumper of a car in order to detect the intention to open the trunk of the vehicle.

The term "door" is understood to mean any opening element of the vehicle, and the terms "locking"/"unlocking" are likewise understood to refer to the mechanical opening of the opening element.

Said device D' comprises:
  a capacitive sensor 100 for detecting the approach and/or contact of a hand of the user toward/with the handle 10', comprising at least one electrode, for example an unlocking electrode E2', located in proximity to a detection surface, in this example in proximity to the first detection surface S1. Said capacitive sensor 100 is capable of detecting the approach or the contact of the hand of the user toward/with the first detection surface S1. The detection method is known to those skilled in the art and will not be described in detail here.
  A microcontroller 60', connected to the capacitive sensor 100, and controlling said sensor.
  A voltage source Vcc, supplying the microcontroller 60' and the sensor 100 with power.

An aspect of invention will be explained here for the unlocking electrode E2, which detects approach and/or the contact of the hand of the user toward/with the first detection surface S1, but an aspect of the invention is applicable to any electrode included in the vehicle, detecting approach and/or contact toward/with a detection surface.

According to an aspect of the invention, the unlocking electrode E2' is not planar like in the prior art, but takes a particular shape.

The unlocking electrode E2' takes, at least partly, the continuous shape of successive arches, which are connected to one another by pointlike junctions.

Figure 5:
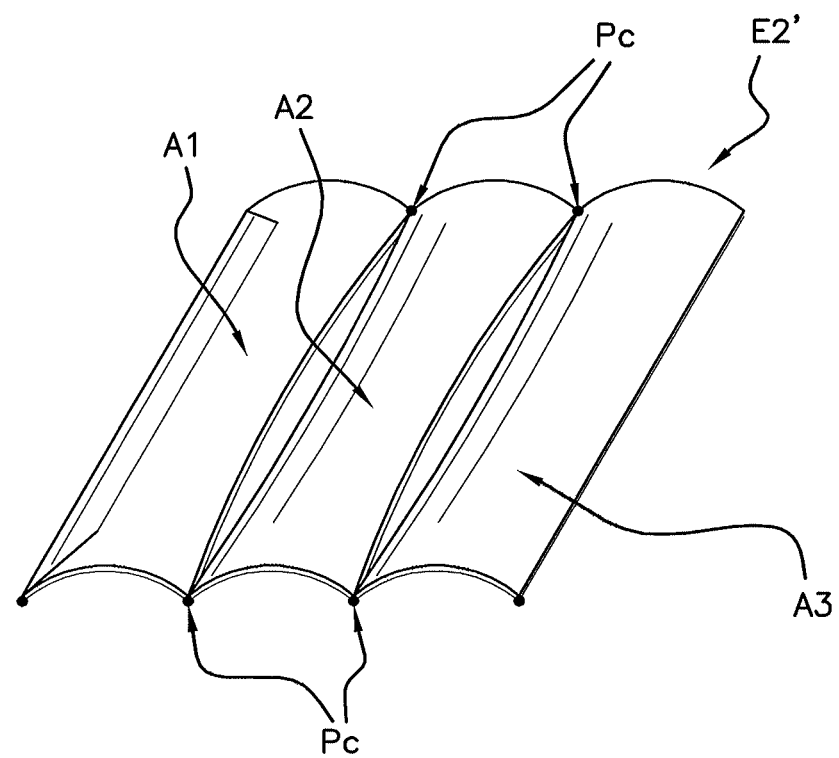
FIG. 5 shows the unlocking electrode E2' according to a first embodiment of an aspect of the invention.
Figure 6:
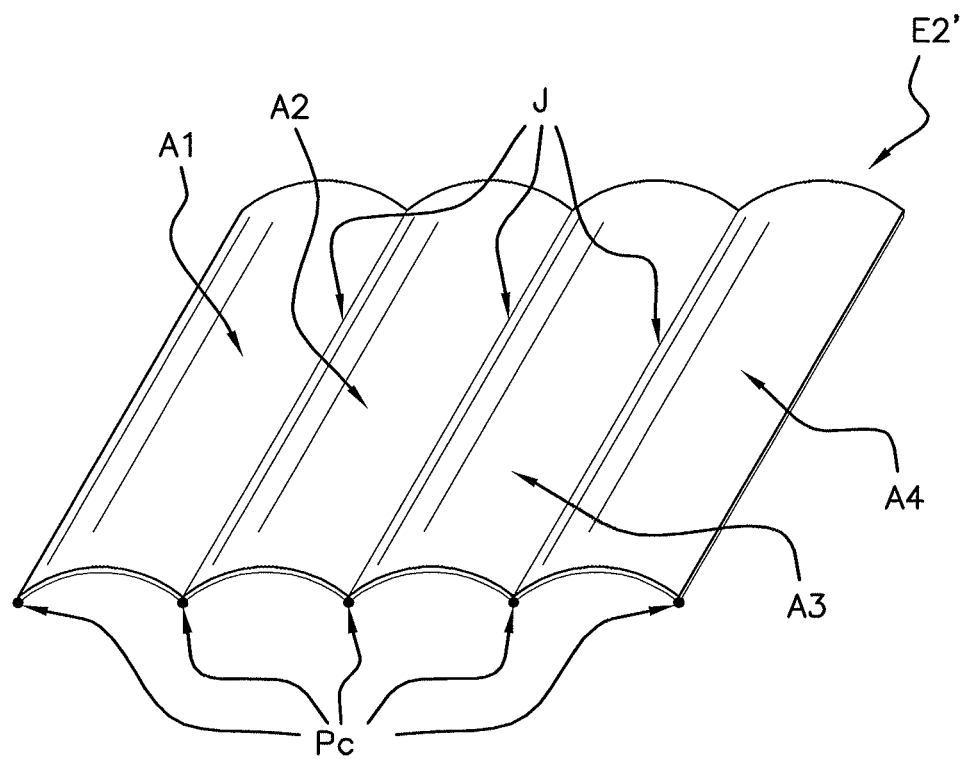
FIG. 6 shows the unlocking electrode E2' according to a second embodiment of an aspect of the invention.

This is illustrated in FIG. 5. The electrode E2' consists of three arches A1, A2, A3. Two successive arches, for example A1 and A2, are connected to one another by two junction points Pc. In FIG. 6, the junctions J between the four arches A1, A2, A3, A4 are all continuous and linear, taking the shape of ridges that extend across the entire width/between each arch.

The term "arch" is understood to mean a shape of a circular arc, which may be rounded or ovoid, having no angular points and having a large radius of curvature, for example larger than 2 cm.

In FIG. 6, the four arches A1, A2, A3, A4 are identical in size and shape. This is provided only by way of illustration and is in no way limiting. The arches may differ in size and shape (radius of curvature).

The junctions, which are either pointlike or linear, J, Pc, are pressed against the first detection surface S1 so as to form a sealtight electrode/detection-surface interface. This is illustrated in FIG. 4.

The unlocking electrode E2' therefore makes contact with the first detection surface S1 via the linear J or pointlike Pc junctions.

The junctions are pressed against the first detection surface S1, in this instance against the inner face of this surface, the first inner surface S1$i$, such that the interface between the unlocking electrode E2' and the first detection surface S1 is sealtight. Thus, water cannot seep between the unlocking electrode E2' and the first detection surface S1 at said junctions Pc, J. The detection zone produced by the unlocking electrode E2' at the junctions J, Pc is therefore reliable.

Moreover, the shape of the arches and the "V" shape of the junctions between two successive arches, which constitute the unlocking electrode E2', result in the electric field being concentrated at the junctions Pc, J. This is illustrated in FIG. 4. The electric field lines Lc arising from the junctions J, Pc form a uniform unlocking zone Z2' around the first detection surface S1. The effectiveness and the sensitivity of the capacitive sensor are therefore enhanced at the junctions Pc, Z, since said junctions make direct contact with the first detection surface S1, which was not possible in the prior art.

Of course, it is possible to modify the size and the shape of the unlocking zone Z2 by adjusting the size and the shape of each of the arches A1, A2, A3 and by adjusting the distribution of the junctions Pc, J along the unlocking electrode E2'.

The arches A1, A2, A3, A4 themselves are formed such that the portions of the electrode E2' forming the arches are set back with respect to the first detection surface S1.

The arches A1, A2, A3, A4 therefore allow water, which might have seeped into the handle 10, to flow away. The arches A1, A2, A3, A4 are cavities that allow water e to flow away.

Other embodiments are conceivable; for example, the unlocking electrode E2' may have arches A1, A2, A3, A4 on an inner face that is oriented on the side of the first detection surface S1 and have a planar upper surface on the side opposite the first detection surface S1.

The junctions Pc, J are then formed in the thickness of the unlocking electrode E2' between two successive arches, and take the shape of ridges, oriented on the side of the first detection surface S1, which are pressed against said detection surface.

Figure 2:
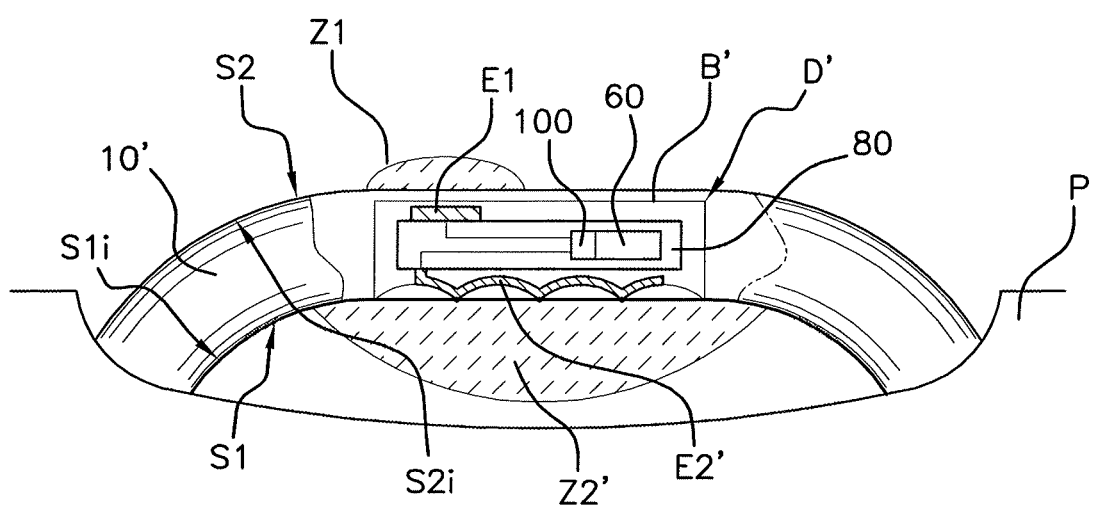
FIG. 2 shows a motor vehicle door P handle 10' comprising a detection device D' according to an aspect of the invention.

FIGS. 2 and 3 illustrate a second embodiment of an aspect of the invention in which the detection device D' is contained within a housing B' incorporated within the handle 10'. In this embodiment, a bottom F of the housing B' is suitable for accommodating the unlocking electrode E2'.

In this instance, the bottom F of the housing is similar in shape to the unlocking electrode E2' and said bottom F also comprises arches $A_{B1}$, $A_{B2}$, $A_{B3}$, $A_{B4}$ (cf. FIG. 3) that are connected to one another at their bases by pointlike $P_B$ or linear $J_B$ junctions (extending over the width of the bottom F) so as to accommodate said unlocking electrode E2', such that at least a portion of the junctions J, Pc of the unlocking electrode E2' are pressed against the junctions $P_B$, $J_B$ of the bottom F of the housing B' and that said junctions $P_B$, $J_B$ of the bottom F of the housing B' are themselves pressed against the first detection surface S1 (i.e. against the first inner surface S1$i$), thus forming a sealtight interface between the unlocking electrode E2', the housing B' and the first detection surface S1.

The arches of the housing $A_{B1}$, $A_{B2}$, $A_{B3}$, $A_{B4}$ allow the water e that would have seeped between said housing B' and the detection surface S1 to be removed.

In a similar way to the first embodiment, the junctions J, Pc, $J_B$, $P_B$ thus formed prevent water from seeping between the unlocking electrode E2', the housing B' and the detection surface S1, and thus guarantee a reliable unlocking zone Z2. The distance between each junction J, Pc of the unlocking electrode E2' and the first detection surface S1 is predetermined (separated only by the thickness of the bottom F of the housing B') and is invariable even in the event of water e infiltration.

The unlocking electrode according to an aspect of the invention may be produced by molding or pressing or else by stamping.

An aspect of the invention is therefore ingenious, inexpensive and straightforward to implement. Simply by modifying the geometry of the electrode, an aspect of the invention allows the device D' for detecting the intention to lock or to unlock to function even if water seeps into the handle.

The capacitive sensor incorporating the electrode of an aspect of the invention is robust and reliable and is not subject to any deterioration in its performance in the event of water seeping into the handle in which it is located.

The invention claimed is:

1. A motor vehicle door handle intended to be installed on a door of a motor vehicle comprising a detection surface, and a device for detecting the intention of a user to lock or to unlock said door, said device comprising:
   a capacitive sensor for detecting the approach and/or contact of a hand of a user toward/with the handle, comprising at least one electrode, located in proximity to the detection surface of the handle, that is capable of detecting the approach of the hand of the user toward the detection surface;
   a microcontroller; and
   a voltage source;
   wherein at least a portion of the at least one electrode takes a continuous shape of successive arches projecting away from the detection surface, cavities of which allow water to flow away, that are connected to one another by junctions, said junctions being pressed in a direction normal to the detection surface and against an inner surface corresponding to an inner surface of the detection surface at respective junction points thus forming an interface between the electrode and the detection surface that is sealtight at said junction points.

2. The handle as claimed in claim 1, each junction between two successive arches has a pointed shape.

3. The handle as claimed in claim 1, wherein each junction between two successive arches forms a continuous linear junction.

4. An automotive vehicle, comprising a handle as claimed in claim 1.

5. A motor vehicle door handle comprising a detection surface, and a device for detecting the intention of a user to lock or to unlock said door, said device comprising:
- a capacitive sensor for detecting the approach and/or contact of a hand of a user toward/with the handle, comprising at least one electrode, located in proximity to a detection surface of the handle, that is capable of detecting the approach of the hand of the user toward the detection surface;
- a microcontroller; and
- a voltage source;

wherein at least a portion of the at least one electrode takes a continuous shape of successive arches, cavities of which allow water to flow away, that are connected to one another by junctions, said junctions being pressed against an inner surface corresponding to an inner surface of the detection surface at respective junction points thus forming an interface between the electrode and the detection surface that is sealtight at said junction points, wherein each junction between two successive arches forms a continuous linear junction, and wherein, the device being contained within a housing, said housing also has, on a bottom, arches that are connected to one another at their base by housing junctions so as to accommodate said electrode, such that at least a portion of the junctions of the electrode are pressed against the housing junctions at the bottom of the housing, said housing junctions being themselves pressed against the detection surface, forming a sealtight interface.

6. The handle as claimed in claim 5, wherein the housing junctions of the bottom of the housing are pointlike.

7. The handle as claimed in claim 5, wherein the housing junctions of the bottom of the housing form continuous linear junctions.

* * * * *